United States Patent
Campbell

(10) Patent No.: US 8,300,332 B2
(45) Date of Patent: Oct. 30, 2012

(54) LENS MOUNTING ASSEMBLY AND METHOD OF ALIGNING LENSES IN A MOUNTING ASSEMBLY

(75) Inventor: Colin Campbell, Edinburgh (GB)

(73) Assignee: STMicroelectronics (Research & Development) Ltd., Marlow, Buckinghamshire (GB)

( * ) Notice: Subject to any disclaimer, the term of this patent is extended or adjusted under 35 U.S.C. 154(b) by 133 days.

(21) Appl. No.: 12/814,112

(22) Filed: Jun. 11, 2010

(65) Prior Publication Data

US 2010/0315622 A1     Dec. 16, 2010

(30) Foreign Application Priority Data

Jun. 15, 2009  (GB) .................... 0910219.5

(51) Int. Cl.
G02B 7/02     (2006.01)
(52) U.S. Cl. ................... 359/819; 359/811
(58) Field of Classification Search ............. 359/819
See application file for complete search history.

(56) References Cited

U.S. PATENT DOCUMENTS

| | | | |
|---|---|---|---|
| 6,381,072 | B1 | 4/2002 | Burger |
| 2003/0011903 | A1 | 1/2003 | Ning |
| 2004/0191948 | A1 | 9/2004 | Ertel et al. |
| 2005/0286143 | A1 | 12/2005 | Chen |
| 2006/0054802 | A1 | 3/2006 | Johnston |
| 2006/0067666 | A1 | 3/2006 | Park et al. |
| 2007/0146905 | A1 | 6/2007 | Kuroda |
| 2009/0109554 | A1* | 4/2009 | Christison ............ 359/823 |
| 2009/0122426 | A1 | 5/2009 | Cheng |

FOREIGN PATENT DOCUMENTS

| | | |
|---|---|---|
| WO | WO-2008096822 A1 | 8/2008 |
| WO | WO-2008146644 A1 | 12/2008 |

OTHER PUBLICATIONS

Search Report, GB0910219.5, Jul. 31, 2009.
EPO Search Report and Written Opinion, mailed Jan. 11, 2011, for EP 10165754 (9 pages).

* cited by examiner

*Primary Examiner* — Ricky Mack
*Assistant Examiner* — James Jones
(74) *Attorney, Agent, or Firm* — Gardere Wynne Sewell LLP

(57) ABSTRACT

A lens mounting assembly includes a lens barrel with a first lens assembly. A lens mount includes an image sensor, and the lens barrel matingly connects with the lens mount in a manner which allows the first lens assembly to be moved along an optical axis to adjust a focus on the image sensor. A second lens assembly is provided for adjusting the focus on the image sensor during use of the lens. An alignment projection is provided on at least one of the first or second lens assemblies, the alignment projection being adapted to mate with a portion of the other of the first or second lens assemblies in order to directly optically align the first and second lens assemblies with the image sensor.

21 Claims, 5 Drawing Sheets

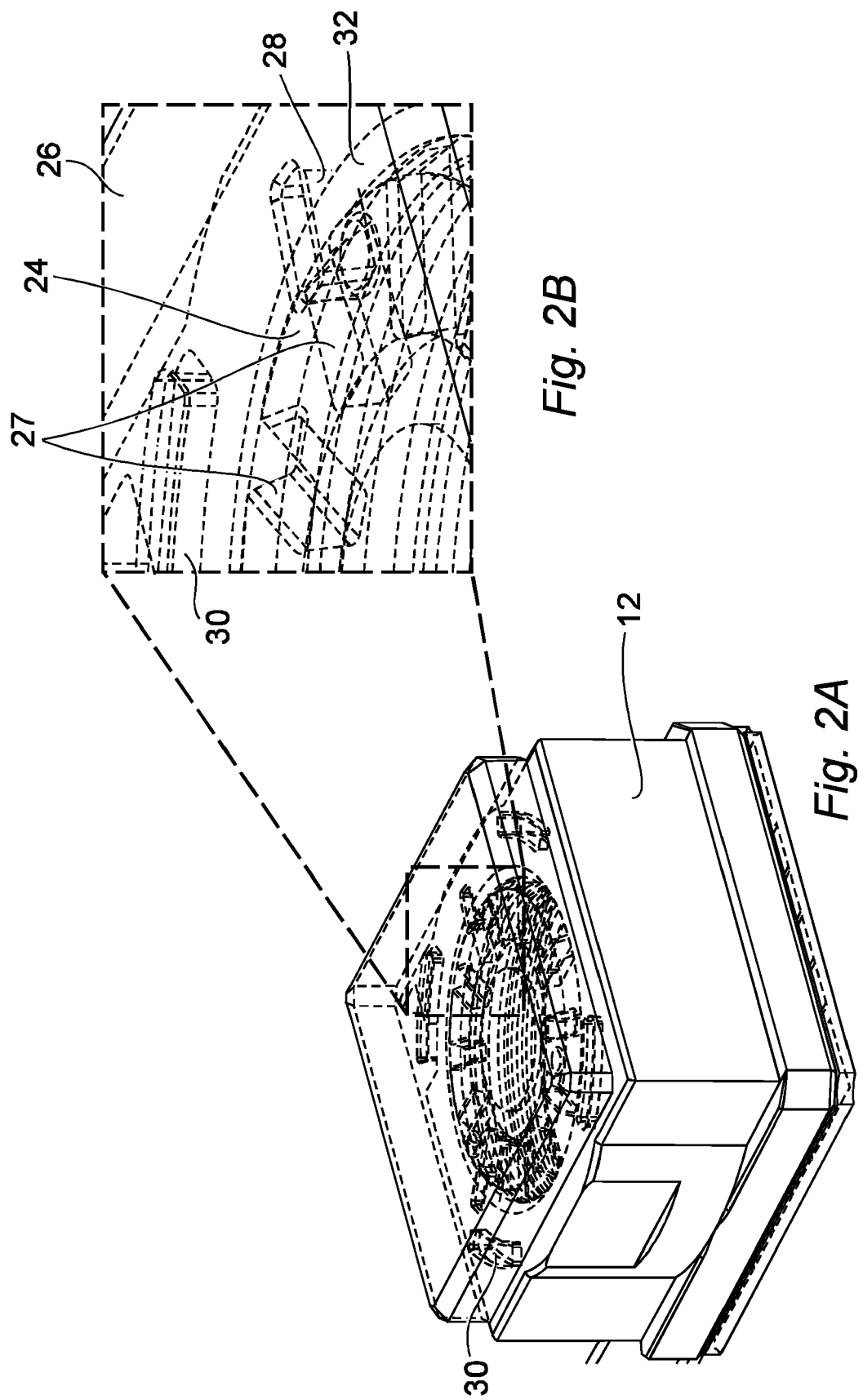

LENS MOUNTING ASSEMBLY AND METHOD OF ALIGNING LENSES IN A MOUNTING ASSEMBLY

PRIORITY CLAIM

The present application claims the benefit of Great Britain Application for Patent No. 0910219.5 filed Jun. 15, 2009, the disclosure of which is hereby incorporated by reference.

TECHNICAL FIELD

The present invention relates to a lens mounting assembly for optically aligning a first and second group of lenses within a lens mount. The invention is particularly, but not exclusively applicable to the manufacture of small, solid state/micro-movement auto focus cameras for use in products such as camera phones and optical pointing devices. A method of aligning lenses in a mounting assembly is also provided.

BACKGROUND

It is known to provide an image sensor or camera assembly having a solid state single chip image sensor held in a lens mount, a first group of lenses held in a lens barrel that is threaded into the lens mount, and an auto focus head which can be used during operation of the camera to adjust the focus on the surface of the image sensor.

In order to obtain satisfactory optical results from such assembled camera lenses, the total degree of optical misalignment/tilt in the assembled camera lens must be within very narrow limits (subsequently referred to as the "tolerance budget"). In particular, the increase in complexity and part count of the lenses used in auto-focus cameras in recent years has made it particularly difficult to keep these cameras within the tolerance budget for a given assembled camera lens. This is because each additional component introduces an additional risk of misalignment/tilt in the assembled lens. For example, in many lenses a first degree of misalignment and tilt is introduced by the coupling between the first group of lenses and the lens barrel, a second by the coupling between the threaded lens barrel and the lens mount, and a third by the coupling between the lens mount and the auto focus stage.

There is a need in the art to address these problems.

SUMMARY

According to an embodiment, a lens mounting assembly for positioning a lens relative to an image sensor comprises: a lens barrel for holding a first lens assembly; a lens mounting having an image sensor mounted thereon; the lens barrel and lens mounting having a mating connection which allows the first lens assembly to be moved along an optical axis to adjust the focus on the image sensor; a second lens assembly for adjusting the focus on the image sensor during use of the lens; and wherein an alignment projection is provided on at least one of the first or second lens assemblies, the alignment projection being adapted to mate with a portion of the other of the first or second lens assemblies in order to directly optically align the first and second lens assemblies with the image sensor.

According to an embodiment, a method of positioning a lens or lens assembly relative to an image sensor comprises: providing a first lens assembly in a lens barrel; mounting an image sensor in a lens mounting; mating the lens barrel and lens mounting together such that the lens barrel and hence the first lens assembly may be moved along an optical axis; moving the lens barrel relative to the image sensor in order to obtain a predetermined focus on the image sensor; providing a second lens assembly on the lens mounting for adjusting the focus on the image sensor during use of the lens assembly; and wherein the step of providing the second lens assembly on the lens mounting further comprises providing an alignment projection on one of the first or second lens assemblies and a corresponding portion on the other of the first or second lens assemblies and abutting the alignment projection of the first or second lens assembly against the corresponding portion on the other of the first or second lens assembly in order to directly align the first and second lens assemblies with the image sensor.

According to an embodiment, an optical device has a lens mounting assembly for positioning a lens relative to an image sensor, wherein the lens mounting assembly comprises: a lens barrel for holding a first lens assembly; a lens mounting having an image sensor mounted thereon; the lens barrel and lens mounting having a mating connection which allows the first lens assembly to be moved along an optical axis to adjust the focus on the image sensor; a second lens assembly for adjusting the focus on the image sensor during use of the lens; and wherein an alignment projection is provided on at least one of the first or second lens assemblies, the alignment projection being adapted to mate with a portion of the other of the first or second lens assemblies in order to directly optically align the first and second lens assemblies with the image sensor.

Further features and advantages of the invention will be made apparent from the following description and the claims.

BRIEF DESCRIPTION OF THE DRAWINGS

Embodiments of the invention will now be described, with reference to the accompanying drawings, in which:

FIG. 2A is a perspective view illustrating the installation of the optical auto-focus head on the lens mounting;

FIG. 2B is an enlarged view of a portion of FIG. 2A which shows in greater detail the interaction between the alignment features of the optical head and the lens barrel;

DETAILED DESCRIPTION OF THE DRAWINGS

Figure 1:
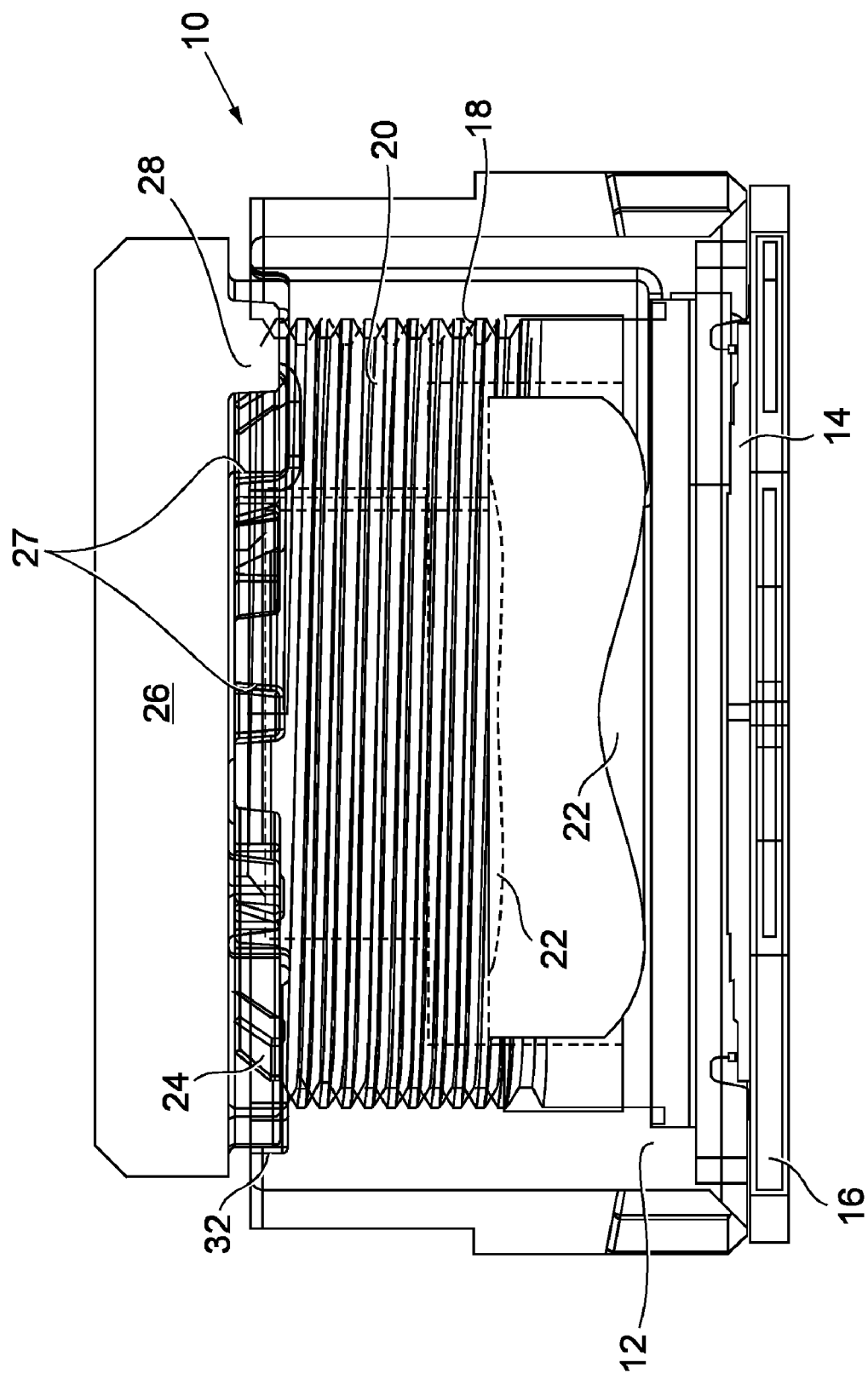
FIG. 1 is a partial cross sectional side view of a lens mounting assembly according to a first embodiment.

With reference to FIG. 1 a lens mounting assembly generally designated 10 is provided. The assembly 10 has a lens mounting 12 which is provided with an integrated solid state single chip image sensor 14 provided on circuitry substrate 16.

The mounting 12 has a threaded section 18 which mates with and receives a corresponding threaded lens barrel 20. The mounting 12 has an upper rim 32 (FIG. 1) adjacent the edge of the threaded section 18 and has securing wells 34 (FIG. 4) at each corner.

Figure 4:
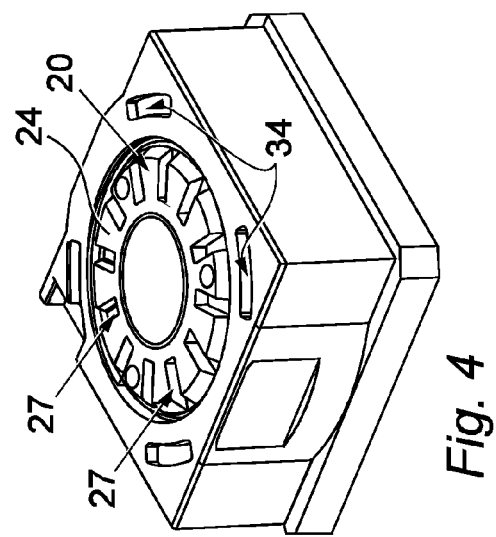
FIG. 4 is a perspective view of the lens mounting of FIG. 2A prior to installation of the optical auto-focus head.

The lens barrel 20 contains a series of fixed lenses 22 (first lens assembly) which remain fixed relative to the image sensor 14 during normal use of the camera lens. As best seen in FIG. 4, the lens barrel 20 has a chamfered upper rim 24 which is provided with a series of alignment notches 27 spaced around its circumference.

In the embodiment shown, the alignment notches 27 are spaced at 30 degree intervals from one another around the circumference of the lens barrel's upper rim 24; however, the notches 27 could be more or less tightly arranged as required.

Figure 3A:
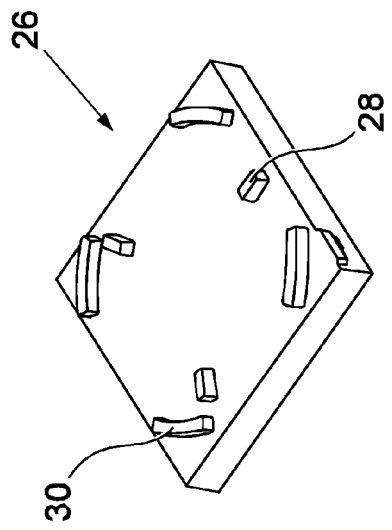
FIG. 3A is a perspective view of the underside of the auto-focus optical head of FIG. 1 where three staggered alignment projections and four corner securing projections are provided.
Figure 5:
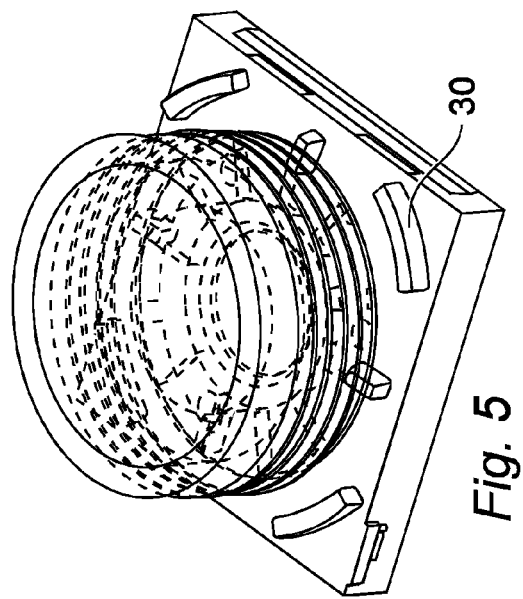
FIG. 5 is a schematic perspective view of the underside of the optical auto-focus head and lens barrel.
Figure 3B:
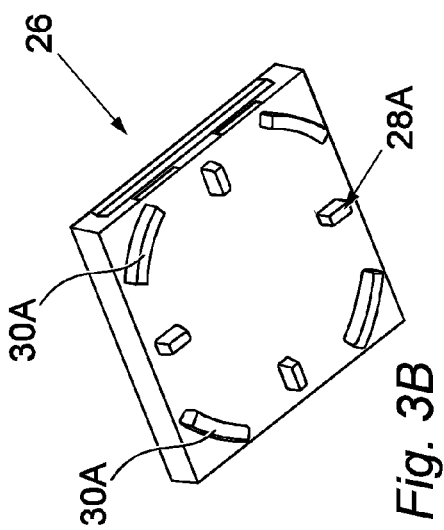
FIG. 3B is a perspective view of the underside of an alternative optical auto-focus head where four alignment projections and four corner securing projections are provided.

A transparent optical auto-focus head 26 (second lens assembly) is provided with three circumferentially spaced alignment projections 28 and four securing projections 30 on its underside (FIG. 3A); however, more or less spaced alignment projections and/or securing projections could be provided as required. For example, in FIG. 3B an alternative embodiment is shown where four alignment projections 28A and four securing projections 30A are provided.

The series of fixed lenses 22 in the lens barrel 20 are not moveable relative to the image sensor 14 during normal use of the camera lens; however, they are moveable during configuration of the lens focus by rotating the lens barrel 20 within the threaded section 18 in order to focus this first lens assembly to the image sensor 14. During use of the camera, the optical auto-focus head 26, which allows light to transmit through its transparent body, can be used to adjust the combined focus of the first and second lens assemblies.

The lens barrel 20 can therefore be focused onto the image sensor 14 during installation, without involvement of the optical auto-focus head 26. As shown in FIGS. 1 and 2A-2B, once the lens barrel 20 has been focused, the optical auto-focus head 26 can be placed onto the top of the lens mounting 12. As this is done, each alignment projection 28 of the optical auto-focus head 26 is received within an alignment notch 27 of the lens barrel upper rim 24. In this regard, the radial position of the alignment projections 28 is such that the radially outer edge of each alignment projection 28 abuts against the radially inner edge of the upper mounting rim 32 and the radially inner portion of each alignment projection 28 will be received within one of the alignment notches 27 of the lens barrel 20. Each securing projection 30 will at the same time be received within one of the corresponding securing wells 34 on the corners of the mounting 12. These may be applied with an adhesive to secure the optical auto-focus head 26 to the mounting 12.

If the position of the alignment projections 28, alignment notches 27, securing projections 30 and securing wells 34 are not angularly aligned with one another when the optical auto-focus head 26 is placed on top of the lens mounting 12 (as will often be the case), the optical auto-focus head 26 can be placed onto the lens barrel 20 such that the alignment projections 28 engage with the nearest alignment notches 27 (this is facilitated by the chamfered edges of the lens barrel rim 24). At this point, the securing projections 30 will not be aligned with the securing wells 34 on the housing 12 and will therefore not engage; however, these can be easily aligned by simply rotating the optical auto-focus head 26 and hence the lens barrel 20 slightly until the securing projections 30 and the securing wells 34 engage. Placement and rotation of the auto-focus head 26 on the lens mounting 12 may be performed by a pick and place machine. Since each alignment notch 27 is spaced apart from the next alignment notch 27 around the rim 24 by only 30 degrees, the maximum amount by which the lens barrel 20 will need to be rotated in order to align the securing projections 30 with the securing wells 34 will be 15 degrees (in the situation where the alignment projections 28 are initially placed exactly half way between the nearest two alignment notches 27). The combined depth of focus of the first lens assembly in the lens barrel 20 is such that a small rotation such as this is within the tolerance required for correct lens focus on the image sensor.

The effect of the described mechanism that both the optical auto-focus head 26 and the lens barrel 20 are directly optically aligned with each other and with the image sensor 14 without any tilt of one relative to the other. This is because a direct physical connection is provided between the alignment projection 28 of the optical auto-focus head 26, the rim 32 of the mounting 12 and the alignment notches 27 of the lens barrel 20. In other words, the direct physical connection described has removed any misalignment or tilt introduced in previous systems. This significantly simplifies manufacturing of the lens assembly within the tolerance budget.

Another advantage is that the lens barrel 20 can be rotated first to a preset focus before the optical auto-focus head 26 is installed. There is therefore an improved ability to manipulate the lens focus during manufacture of the lens mounting assembly 10 which results in an improvement in overall optical performance thereof.

Furthermore, the provision of the securing projections 30 and securing wells 34 away from the alignment projections 28 and alignment notches 27 minimizes the risk of any securing adhesive interfering with the optics of the camera lens 10 or indeed its optical alignment with the image sensor 14. In this regard, in order to avoid interfering with the otherwise direct physical contact between the securing projections 30 and the securing wells 34, a non-contact adhesive may be used, whereby the adhesive is provided at, for example, the side wall of the securing projections 30 and securing wells 34; in such a configuration, the direct physical contact (and hence the improved alignment) between the alignment faces of the securing projections 30 and securing wells 34 is maintained.

With reference to FIGS. 6 to 9 a second embodiment will now be described. In order to minimize repetition, similar features of the lens mounting apparatus described subsequently have been numbered with a common two-digit reference numeral and have been differentiated by a third digit placed before the two common digits. Such features are structured similarly, operate similarly, and/or have similar functions as previously described unless otherwise indicated.

Figure 6:
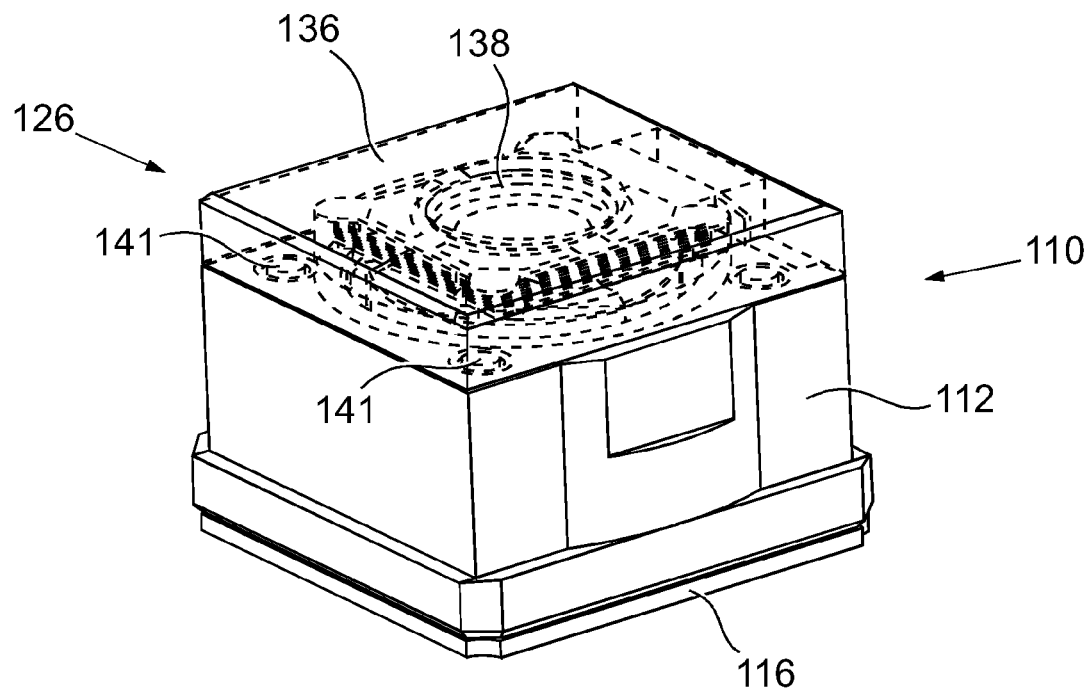
FIG. 6 is a perspective view of a lens mounting assembly according to a second embodiment.
Figure 7:
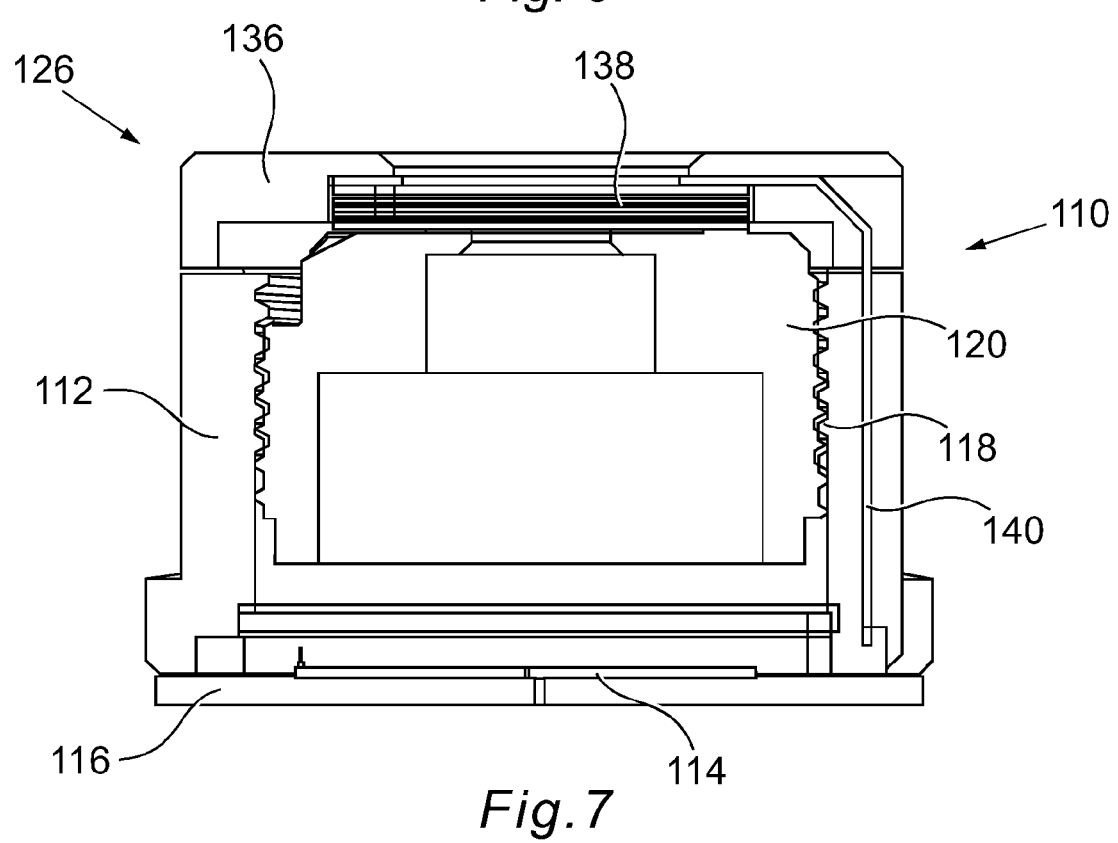
FIG. 7 is a cross sectional view of the lens mounting assembly of FIG. 6.

A lens mounting assembly according to a second embodiment is generally designated 110. As shown in FIGS. 6 and 7, the lens mounting assembly 110 has a lens mounting 112 which is provided with an integrated solid state single chip image sensor 114 provided on a circuit substrate 116. The lens mounting 112 has a threaded section 118 which receives a corresponding threaded lens barrel 120 and is provided with securing wells 141 at each corner.

Figure 9:
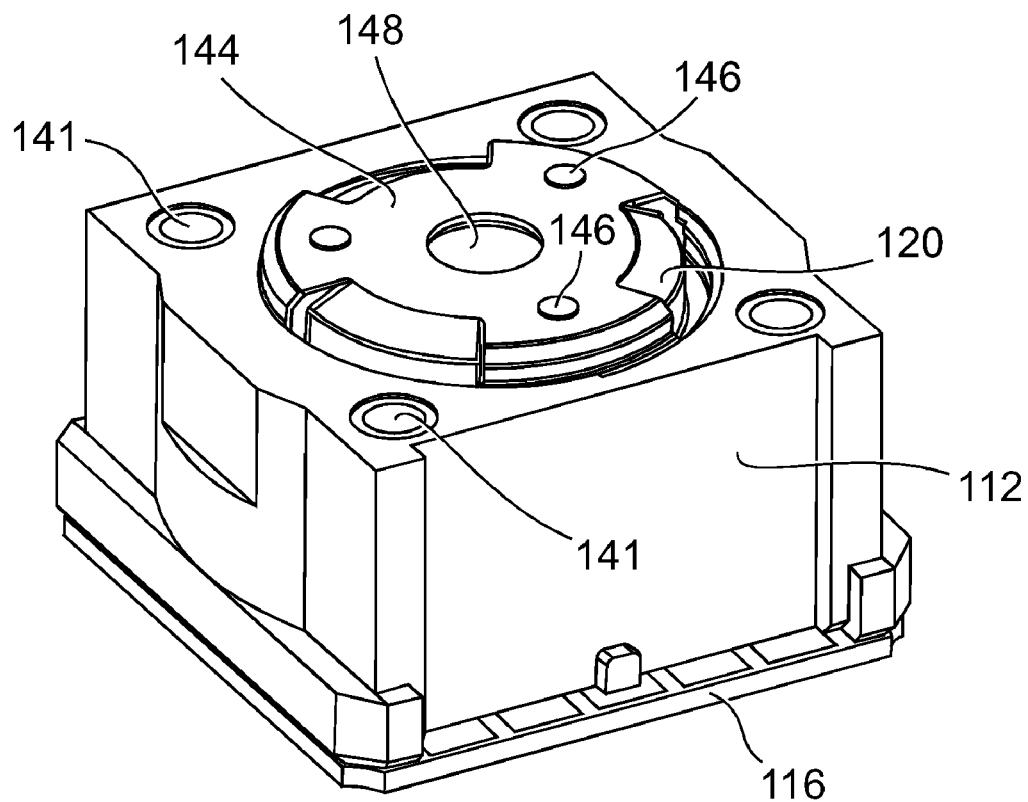
FIG. 9 is a perspective view of the lens mounting assembly prior to installation of the optical auto-focus head of FIG. 8.

The lens barrel 120 has a cap 144 with three alignment formations 146 arranged around a central lens aperture 148 (FIG. 9). The lens barrel 120 contains a series of fixed lenses (not shown, see FIG. 1) which remain fixed relative to the image sensor 114 during normal use of the lens mounting assembly 110.

Figure 8:
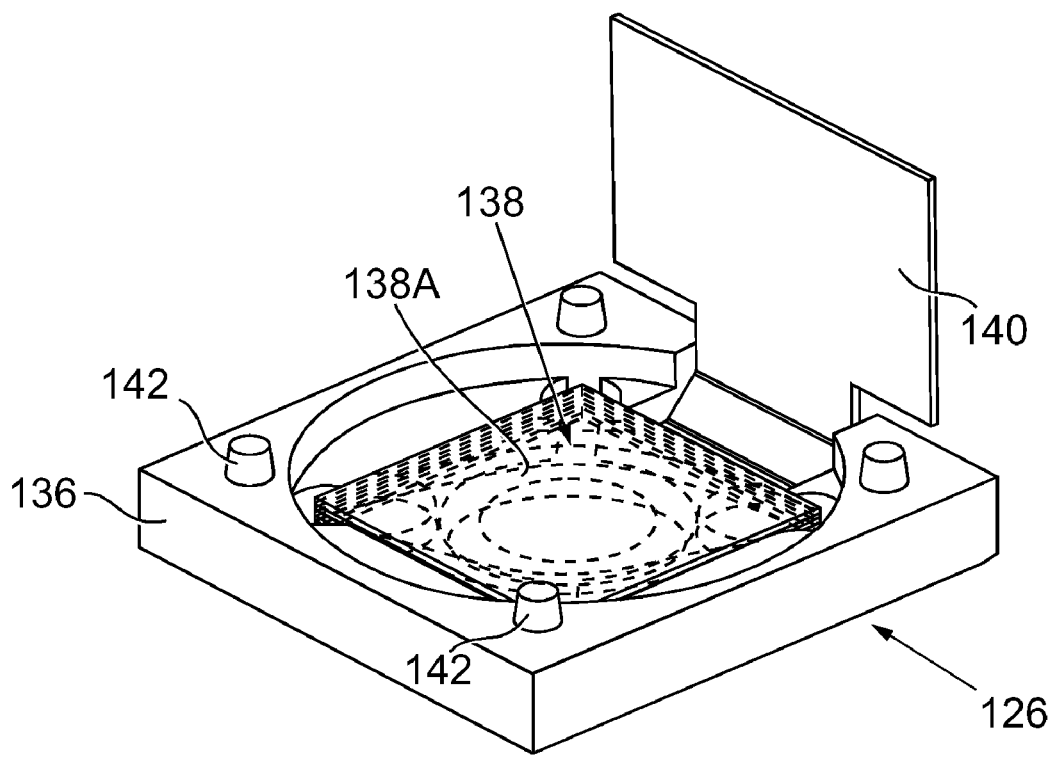
FIG. 8 is a detailed view of the underside of the optical auto-focus head prior to installation on the lens mounting assembly of the invention.

As best seen in FIG. 8, an opaque optical auto-focus head 126 comprises a carrier frame 136, an optical cell 138, which may be a solid state or micro-movement cell, and an electrical connector 140. The carrier frame 136 is provided with securing projections 142 which are positioned at each corner of the carrier frame 136 to correspond with the securing wells 141 on the mounting 112. The optical cell 138 allows light to pass through it and has fiducial markers 138A printed thereon to provide an optical point of reference relative to the optical axis of the cell 138 as described subsequently.

The lens barrel 120 is focused onto the image sensor 114 during manufacture of the lens mounting assembly 110, without involvement of the optical cell 138. As shown in FIGS. 6 and 7, the optical auto-focus head 126 is then placed onto the lens mounting 112 such that each securing projection 142 is received within a securing well 141 of the lens mounting 112. The lateral alignment and placing of the optical auto-focus head 126 on the mounting assembly 110 may be performed by a pick and place machine. Adhesive may be applied in the securing wells 141 to more permanently secure the optical auto-focus head 126 to the lens mounting 112.

In this way, the surface of the optical cell 138 will abut directly onto the three alignment projections 146 on the lens barrel 120 thereby providing an accurate positional reference point for alignment. The resulting accurate positional reference can then be used in conjunction with the fiducial markers 138A by the imaging software to configure the alignment and tilt and hence the imaging performance of the lens assembly using known imaging techniques.

Modifications and improvements may be made to the foregoing, without departing from the scope of the invention, for example:

A greater or lesser number of alignment and/or securing features may be provided in the described embodiments as required application. Furthermore, in the specific embodiments described, alignment projections 28 are provided on the optical auto-focus head 26 and notches on the lens barrel 20; however, this could be easily reversed if desired (in other words, alignment projections could be provided on the lens barrel 20 and notches on the optical auto-focus head 26). Indeed a mixture of alignment projections and notches could be provided on each of the auto-focus head 26 and the lens barrel 20.

What is claimed is:

1. A lens mounting assembly, comprising:
a lens barrel including a first optical lens assembly;
a lens mounting having an image sensor mounted thereon;
wherein the lens barrel and lens mounting have a mating connection configured to allow focus adjustment by movement of the lens barrel along an optical axis of the first optical lens assembly;
a second optical lens assembly configured to provide further focus adjustment;
an alignment projection provided on one of the second optical lens assembly or lens barrel;
an alignment notch provided on the other of the second optical lens assembly or lens barrel,
wherein the alignment projection is adapted to mate with the alignment notch in order to optically align the first and second optical lens assemblies with the image sensor;
a securing projection provided on one of the second optical lens assembly or lens mounting; and
a securing well provided on the other one of the second optical lens assembly or lens mounting;
wherein the securing projection is adapted to mate with the securing well in order to attach the second optical lens assembly to the lens mounting.

2. The lens mounting assembly according to claim 1, wherein the alignment projection and alignment notch correspond to angularly align the first and second optical lens assemblies.

3. The lens mounting assembly according to claim 1, wherein the second optical lens assembly comprises an optical cell having fiducial markers, and the lens barrel comprises at least an alignment mechanism which abuts against the optical cell providing a positional reference point.

4. The lens mounting assembly according to claim 3 wherein the alignment mechanism is used in conjunction with the fiducial markers to accurately align the first and second optical lens assemblies with the image sensor.

5. The lens mounting assembly according to claim 1, wherein the first optical lens assembly comprises a fixed distance optical lens stack and the second optical lens assembly comprises an auto-focus optical lens arrangement.

6. A lens mounting assembly, comprising:
a lens barrel including a first optical lens assembly;
a lens mounting having an image sensor mounted thereon;
the lens barrel and lens mounting having a mating connection which allows the first optical lens assembly to be moved along an optical axis to adjust a focus on the image sensor;
a second optical lens assembly for adjusting the focus on the image sensor; and
an alignment projection provided for one of the first or second optical lens assemblies, the alignment projection being adapted to mate with a portion provided for the other of the first or second optical lens assemblies in order to optically align the first and second lens assemblies with the image sensor;
wherein one of the lens mounting and second lens assembly is provided with a securing projection and the other of the lens mounting and second lens assembly is provided with a securing well which corresponds with the securing projection in order to facilitate attachment and angular alignment of the lens mounting and second lens assembly to one another.

7. The lens mounting assembly according to claim 6, wherein the securing well is adapted to receive an adhesive in order to fix the relative position of the second optical lens assembly and the mounting.

8. The lens mounting assembly according to claim 6, wherein at least a notch is provided on the lens barrel and at least a corresponding projection is provided on the second optical lens assembly such that when the securing well and securing projection are aligned, the projection of the second optical lens assembly will reside within the notch of the lens barrel in order to directly align the first and second optical lens assemblies with the image sensor.

9. The lens mounting assembly according to claim 8, wherein the lens barrel and the lens mounting are threadedly engaged with one another such that the lens barrel may rotate within the lens mounting.

10. The lens mounting assembly according to claim 8, wherein a series of notches are circumferentially spaced around a rim of the lens barrel and wherein the rim is provided with a chamfered edge to facilitate location of the projection therein.

11. The lens mounting assembly according to claim 10, wherein the number of notches provided on the rim of the lens barrel and hence the circumferential spacing between each notch is such that the maximum degree of rotation of the lens barrel required in order to align the securing well and securing projection does not adversely affect the focus of the lens barrel on the image sensor.

12. A method of positioning a lens or lens assembly relative to an image sensor including a first lens assembly in a lens barrel and an image sensor in a lens mounting, the method comprising:
   mating the lens barrel and lens mounting together such that the lens barrel and hence the first lens assembly may be moved along an optical axis;
   moving the lens barrel relative to the image sensor in order to obtain a focus on the image sensor;
   providing a second lens assembly on the lens mounting for adjusting the focus on the image sensor;
   providing an alignment projection for one of the first and second lens assemblies;
   providing a corresponding alignment notch for the other of the first and second lens assemblies; and
   mating the alignment projection in the corresponding alignment notch in order to optically align the first and second lens assemblies with the image sensor;
   providing a securing notch for one of the lens mounting and second lens assembly;
   providing a corresponding securing projection for the other of the lens mounting and second lens assembly; and
   aligning the securing projection and securing notch in order to attach the second lens assembly to the lens mounting.

13. The method according to claim 12, wherein mating said alignment projection and notch to one another angularly aligns the first and second lens assemblies.

14. The method according to claim 12, further comprising providing the second lens assembly with an optical cell having fiducial markers, and providing the first lens assembly with at least an alignment projection which abuts against the optical cell in order to provide a vertical reference point.

15. The method according to claim 14, further comprising using the resulting vertical reference point in conjunction with the fiducial markers to accurately align the first and second lens assemblies with the image sensor.

16. A method of positioning a lens or lens assembly relative to an image sensor including a first lens assembly in a lens barrel and an image sensor in a lens mounting, the method comprising:
   mating the lens barrel and lens mounting together such that the lens barrel and hence the first lens assembly may be moved along an optical axis;
   moving the lens barrel relative to the image sensor in order to obtain a focus on the image sensor;
   providing a second lens assembly on the lens mounting for adjusting the focus on the image sensor during use of the lens assembly;
   providing an alignment mechanism on one of the first and second lens assemblies and a corresponding alignment mechanism on the other of the first and second lens assemblies and abutting the alignment mechanism of the first and second lens assembly against the corresponding alignment mechanism on the other of the first and second lens assembly in order to optically align the first and second lens assemblies with the image sensor; and
   angularly aligning and securing the lens mounting and the second lens assembly to one another using at least a securing projection provided on one of the lens housing and the second lens assembly, and at least a corresponding securing well on the other of the lens housing and the second lens assembly.

17. The method according to claim 16, further comprising fixing the second lens assembly and the mounting using an adhesive provided at or near the securing projections and securing wells.

18. The method according to claim 17, wherein when the alignment projection and the alignment notch are not aligned when the second lens assembly is placed on the lens mounting, the method further comprising the step of engaging the alignment projection with a nearest alignment notch, and rotating the lens barrel until the securing projection engages the securing notch.

19. An optical device having a lens mounting assembly, the lens mounting assembly comprising:
   a lens barrel including a first optical lens assembly;
   a lens mounting having an image sensor mounted thereon;
   wherein the lens barrel and lens mounting having a threaded mating connection which allows the lens barrel to be rotated about an optical axis of the first optical lens assembly to make a focus adjustment;
   a second optical lens assembly configured to make further focus adjustment;
   an alignment projection provided for one of the first or second optical lens assemblies; and
   an alignment notch provided for the other of the first or second optical lens assemblies,
   wherein the alignment projection is adapted to mate with the alignment notch to optically align the first and second optical lens assemblies.

20. The optical device of claim 19, further comprising:
   a securing projection provided on one of the second optical lens assembly or lens mounting; and
   a securing well provided on the other of the second lens assembly or lens mounting;
   wherein the securing projection is adapted to mate with the securing well in order to attach an under surface of the second lens assembly to an upper surface of the lens mounting.

21. A lens mounting, comprising:
   a lens barrel including a peripheral rim surrounding a first lens;
   a lens mounting having an image sensor mounted thereon;
   wherein the lens barrel and lens mounting having a mating connection which allows the lens barrel to be moved along an optical axis of the first lens to adjust focus;
   an autofocus lens assembly including a second lens movable for further focus adjustment;
   an alignment projection provided on an underside surface of the autofocus lens assembly;
   a securing projection provided on the underside surface of the autofocus lens assembly;
   an alignment well provided on the peripheral rim of the lens barrel; and
   a securing well provided on an upper surface of the lens mounting,
   wherein the alignment projection is adapted to mate with the alignment well to facilitate optical axis alignment of the first and second lenses, and wherein the securing projection is adapted to mate with the securing well to facilitate attachment of the autofocus lens assembly to the lens mounting.

* * * * *